US009090962B2

(12) United States Patent
Tebakari et al.

(10) Patent No.: US 9,090,962 B2
(45) Date of Patent: Jul. 28, 2015

(54) SILICON SEED ROD ASSEMBLY OF POLYCRYSTALLINE SILICON, METHOD OF FORMING THE SAME, POLYCRYSTALLINE SILICON PRODUCING APPARATUS, AND METHOD OF PRODUCING POLYCRYSTALLINE SILICON

(71) Applicant: MITSUBISHI MATERIALS CORPORATION, Tokyo (JP)

(72) Inventors: Masayuki Tebakari, Saitama (JP); Naoki Hatakeyama, Yokkaichi (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 54 days.

(21) Appl. No.: 13/858,513

(22) Filed: Apr. 8, 2013

(65) Prior Publication Data
US 2013/0224401 A1  Aug. 29, 2013

Related U.S. Application Data

(62) Division of application No. 12/318,270, filed on Dec. 23, 2008, now abandoned.

(30) Foreign Application Priority Data

Dec. 28, 2007 (JP) .................. 2007-338409

(51) Int. Cl.
*H05B 6/02* (2006.01)
*B21D 39/03* (2006.01)
(Continued)

(52) U.S. Cl.
CPC ............... *C23C 16/02* (2013.01); *C01B 33/035* (2013.01); *C23C 16/24* (2013.01); *Y10T 29/49826* (2015.01); *Y10T 117/10* (2015.01)

(58) Field of Classification Search
None
See application file for complete search history.

(56) References Cited

U.S. PATENT DOCUMENTS 2,763,581 A    9/1956  Freedman
2,999,735 A *  9/1961  Reuschel ................. 423/350
(Continued)

FOREIGN PATENT DOCUMENTS

EP    0498887 A1   8/1992
GB    1368370 A    9/1974
(Continued)

OTHER PUBLICATIONS

European Search Report dated Jun. 25, 2009, issued on the corresponding European patent application No. 08172840.4.
(Continued)

*Primary Examiner* — Bijay Saha
(74) *Attorney, Agent, or Firm* — Locke Lord LLP

(57) ABSTRACT

A silicon seed rod assembly used for producing polycrystalline silicon by means of a vapor deposition method includes two rod-shape silicon seed rods; and a silicon connection member bridging the silicon seed rods, wherein an opening-end peripheral edge of a through-hole on one side surface of the connection member is sharper than that on the other side surface thereof, and an opening-end peripheral surface on the one side surface thereof is formed into a flat contact surface disposed in a direction perpendicular to a perforation direction of the through-hole, and wherein a upper end portion of the silicon seed rod is inserted into the through-hole so that the contact surface comes into contact with the support surface of the silicon seed rod.

3 Claims, 8 Drawing Sheets

(51) Int. Cl.
*C23C 16/02* (2006.01)
*C01B 33/035* (2006.01)
*C23C 16/24* (2006.01)

(56) References Cited

U.S. PATENT DOCUMENTS

| | | | |
|---|---|---|---|
| 3,011,877 A | * | 12/1961 | Reuschel et al. .............. 422/199 |
| 3,746,496 A | * | 7/1973 | Dietze et al. ................. 425/447 |
| 3,820,935 A | | 6/1974 | Dietze |
| 5,352,523 A | * | 10/1994 | Zurecki et al. ................ 428/408 |

FOREIGN PATENT DOCUMENTS

| | | |
|---|---|---|
| JP | 07-029874 B | 4/1995 |
| JP | 3819252 | 11/2002 |
| JP | 3881647 | 4/2005 |
| JP | 2007-136909 A | 6/2007 |
| JP | 2009-062251 A | 3/2009 |

OTHER PUBLICATIONS

Office Action mailed Jan. 22, 2013, issued for the Japanese patent application No. 2008-323585 and English translation thereof.

* cited by examiner

SILICON SEED ROD ASSEMBLY OF POLYCRYSTALLINE SILICON, METHOD OF FORMING THE SAME, POLYCRYSTALLINE SILICON PRODUCING APPARATUS, AND METHOD OF PRODUCING POLYCRYSTALLINE SILICON

This application is a divisional application of U.S. application Ser. No. 12/318,270 filed Dec. 23, 2008, now abandoned, which claims the right of priority under 35 U.S.C. § 119 based on Japanese Patent Application No. 2007-338409 filed Dec. 28, 2007.

BACKGROUND OF THE INVENTION

1. Field of the Invention

The present invention relates to a silicon seed rod assembly used for producing polycrystalline silicon in a polycrystalline silicon reaction furnace, and a method of forming the same. Further, the present invention relates to a polycrystalline silicon producing apparatus employing the silicon seed rod assembly and a method of producing polycrystalline silicon.

Priority is claimed on Japanese Patent Application No. 2007-338409, filed Dec. 28, 2007, the content of which is incorporated herein by reference.

2. Description of the Related Art

In general, the Siemens method is known as a method of producing high-purity polycrystalline silicon used as a semiconductor material. The Siemens method is a method of making raw gas composed of mixed gas of chlorosilane and hydrogen to contact with a heated silicon seed rod assembly and of making polycrystalline silicon deposited on a surface of the silicon seed rod assembly by means of a reaction of the raw gas. In an apparatus for adopting the Siemens method, a polycrystalline silicon reaction furnace is used in which a plurality of silicon seed rod assemblies is uprightly provided in a hermetic reaction furnace (see Japanese Patent No. 3819252 and Japanese Patent No. 3881647).

Each silicon seed rod assembly includes two rod-shaped silicon seed rods and a connection member connecting the upper end portions of the silicon seed rods to each other, thereby forming the silicon seed rod assembly in a Π-shape. Then, the lower end portion of the silicon seed rod is fixed to an electrode provided in a bottom of the polycrystalline silicon reaction furnace. The silicon seed rod assembly is heated by supplying current from the electrode at the lower end portion thereof. Then, the raw gas is thermally decomposed or is reduced with hydrogen by joule heat produced at this time, thereby making polycrystalline silicon deposited on the surface of the silicon seed rod assembly.

A section of the rod-shaped silicon seed rod is formed in a square shape, a circular shape, or a shape in which angular portions of a square shape are R-chamfered. In general, since it is necessary to make the upper end portion to be inserted through a through-hole having an annular-hole shape and to support the connection member, the upper end portion connected to the connection member is formed in a cylindrical shape so as to have a diameter slightly smaller than that of the through-hole.

That is, a step portion is formed between an upper end portion and a main body portion of the silicon seed rod since a width of the upper end portion is smaller than that of the main body portion. The step portion is provided with a flat support surface disposed in a direction perpendicular to a longitudinal direction of the silicon seed rod. Then, the upper end portions of the two silicon seed rods are inserted through the through-holes formed in both end portions of the connection member, and the support surface supports an opening-end peripheral edge of the through-hole on the side of the lower surface of the connection member, thereby forming the silicon seed rod assembly.

Incidentally, upon forming the through-hole in the connection member, the through-hole is formed by perforating the connection member by means of a drill from the one side surface toward the other side surface thereof. However, a petal-shape defect portion may be formed in the opening-end peripheral edge on the side of the other side surface in a perforation direction due to brittleness of the connection member. In a case where the silicon seed rod assembly is formed so that the other side surface having the defect portion formed thereon comes into contact with the support surface, a contact area between the connection member and the silicon seed rod decreases.

In a case where a contact state between the silicon seed rod and the connection member is poor, a problem arises in that a meltdown of the contact portion may occur due to local overheating during an ohmic heating. In order to obtain a satisfactory contact state between the silicon seed rod and the connection member, a study has been carried out which improves perpendicularity upon connecting the silicon seed rod and the connection member to each other in order to obtain a satisfactory contact between the silicon seed rod and the connection member. However, a countermeasure for coping with a contact between the support surface of the silicon seed rod and the opening-end peripheral edge of the through-hole of the connection member has not been taken. For this reason, in order to prevent the meltdown caused by overheating, it is required to satisfactorily ensure the contact area therebetween.

SUMMARY OF THE INVENTION

The present invention is contrived in consideration of the above-described circumstances, and an object of the invention is to provide a silicon seed rod assembly capable of satisfactorily ensuring a contact area between a silicon seed rod and a connection member and of producing polycrystalline silicon through a reliable process, and a method of forming the silicon seed rod assembly. Further, an object of the invention is to provide a polycrystalline silicon producing apparatus using the silicon seed rod assembly and a method of producing polycrystalline silicon.

In order to achieve the above-described object, the present invention adopts the following configuration. That is, according to an aspect of the invention, there is disclosed a silicon seed rod assembly used for producing polycrystalline silicon by means of a vapor deposition method, the silicon seed rod assembly including: two rod-shaped silicon seed rods; and a silicon connection member bridging the silicon seed rods, wherein a width of an upper end portion of each silicon seed rod is smaller than that of a main body portion thereof, wherein a step portion formed between the upper end portion and the main body portion is provided with a support surface disposed in a direction perpendicular to a longitudinal direction of the upper end portion, wherein the connection member is provided with a through-hole into which the upper end portion is inserted, wherein an opening-end peripheral edge of the through-hole on one side surface of the connection member is sharper than that on the other side surface thereof, and an opening-end peripheral surface on the one side surface thereof is formed into a flat contact surface disposed in a direction perpendicular to a perforation direction of the through-hole, and wherein the upper end portion is inserted into the through-hole so that the contact surface comes into contact with the support surface of the silicon seed rod.

According to another aspect of the invention, there is disclosed a method of forming a silicon seed rod assembly which is used for producing polycrystalline silicon by means of a vapor deposition method and includes two rod-shaped silicon seed rods and a silicon connection member bridging the silicon seed rods, the method including the steps of: forming an upper end portion, of which a width is smaller than that of a main body portion, at an upper end of each silicon seed rod; forming a support surface at a step portion between the upper end portion and the main body portion so as to be disposed in a direction perpendicular to a longitudinal direction of the upper end portion; forming a through-hole by perforating the connection member from one side surface thereof by means of a drill in a direction perpendicular to the one side surface; and inserting the upper end portion into the through-hole so that the one side surface comes into contact with the support surface of the silicon seed rod.

According to the silicon seed rod assembly and the method of forming the same according to the invention, the opening-end peripheral edge of the through-hole on one side surface of the connection member is sharper than that on the other side surface thereof, the opening-end peripheral surface on the one side surface thereof is formed into the flat contact surface, the support surface of the silicon seed rod comes into contact with the contact surface, and then the connection member is supported by the two silicon seed rods, thereby forming the silicon seed rod assembly. Accordingly, since it is possible to satisfactorily ensure the contact area between the silicon seed rod and the connection member, it is possible to restrict an increase in the contact resistance therebetween and to prevent the meltdown of the contact portion caused by overheating during an ohmic heating.

Further, in the silicon seed rod assembly according to the invention, the connection member may include an inclined surface of which a width gradually decreases from the downside to the upside. Accordingly, the connection member is formed in a shape in which silica or foreign material flowing from the above of the connection member is hardly collected or attached thereto upon producing the polycrystalline silicon, thereby producing highly pure polycrystalline silicon.

According to still another aspect of the invention, there is disclosed a polycrystalline silicon producing apparatus including: the silicon seed rod assembly according to the above-described aspect provided in a reaction furnace, wherein at least a pair of electrodes is provided in a bottom portion in the reaction furnace, and end portions, disposed on the opposite side of the connection member, of both silicon seed rods of the silicon seed rod assembly are supported by the electrodes, respectively.

Since local overheating of the silicon seed rod assembly is prevented, it is possible to reliably produce polycrystalline silicon.

According to still another aspect of the invention, there is disclosed a method of producing polycrystalline silicon including the steps of: forming a silicon seed rod assembly by uprightly supporting silicon seed rods by a pair of electrodes, respectively, disposed in a bottom portion in a reaction furnace and by providing a silicon connection member between upper end portions of the silicon seed rods; heating the silicon seed rods by supplying current to the electrodes; reacting the raw gas supplied to the reaction furnace; and depositing polycrystalline silicon on surfaces of the silicon seed rods, wherein the step of forming the silicon seed rod assembly includes the steps of: forming an upper end portion, of which a width is smaller than that of a main body portion, at an upper end of each silicon seed rod and forming a support surface at a step portion between the upper end portion and the main body portion so as to be disposed in a direction perpendicular to a longitudinal direction of the upper end portion; forming a through-hole by perforating the connection member from one side surface thereof by means of a drill in a direction perpendicular to the one side surface; and inserting the upper end portion into the through-hole so that the one side surface comes into contact with the support surface of the silicon seed rod in a state where the silicon seed rods are supported by the electrodes provided in the reaction furnace, respectively.

According to the invention, since it is possible to satisfactorily ensure the contact area between the silicon seed rod and the connection member, it is possible to restrict an increase in the contact resistance therebetween and to reliably produce the polycrystalline silicon.

BRIEF DESCRIPTION OF THE DRAWINGS

FIG. 4(a) is a sectional view showing an opening-end peripheral edge of a through-hole formed in an upper surface of the connection member, FIG. 4(b) is a sectional view showing the through-hole, and FIG. 4(c) is a sectional view showing an opening-end peripheral edge formed in a lower surface of the connection member.

FIG. 8(a) shows a state where a pair of silicon seed rods is uprightly formed in an electrode, and FIG. 8(b) shows a state where the pair of silicon seed rods is connected to each other by means of the connection member.

DETAILED DESCRIPTION OF THE INVENTION

Figure 1:
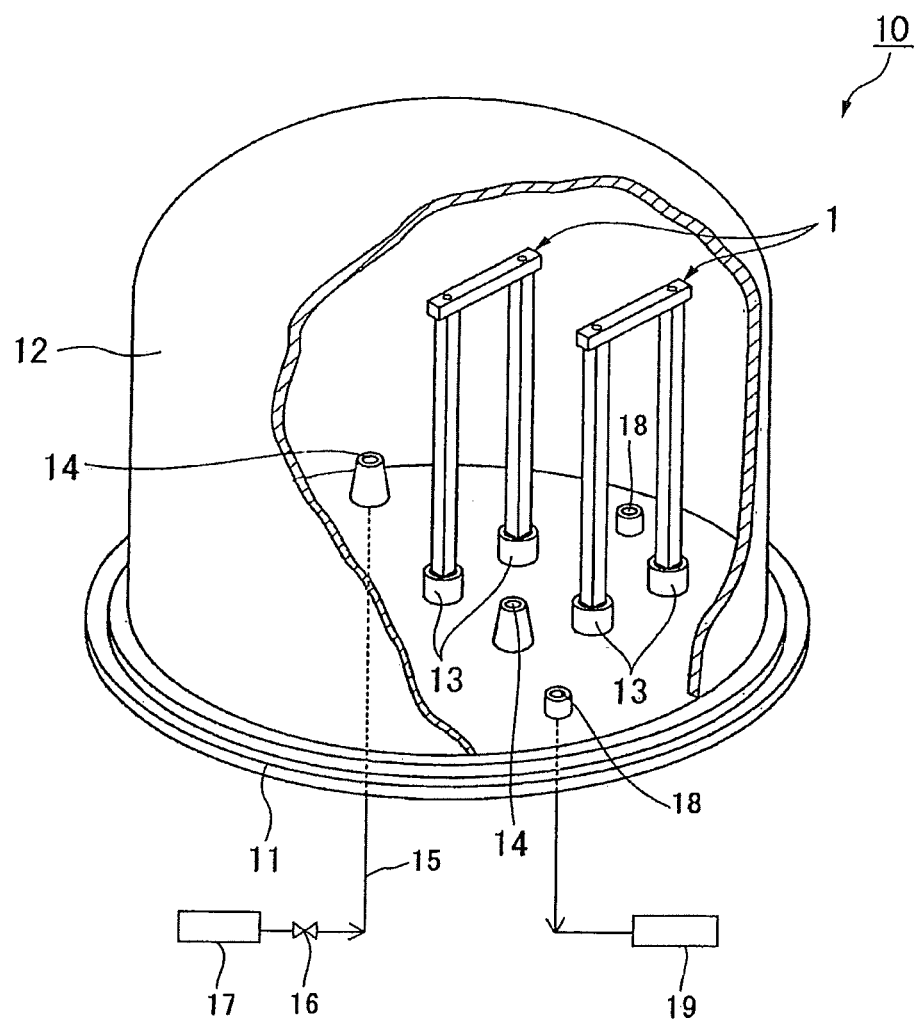
FIG. 1 is a schematic perspective view showing a configuration of a polycrystalline silicon reaction apparatus according to an embodiment of the invention.

Hereinafter, exemplary embodiments of the invention will be described with reference to the accompanying drawings. As shown in FIG. 1, a polycrystalline silicon producing apparatus includes a polycrystalline silicon reaction furnace 10. The polycrystalline silicon reaction furnace 10 is provided with a bell jar 12 formed in a bell shape so as to cover the whole upper portion of a round furnace bottom 11, and the inside of the polycrystalline silicon reaction furnace 10 is sealed by the furnace bottom 11 and the bell jar 12. The sealed inside portion is provided with a plurality of upright silicon seed rod assemblies 1 which is formed in a substantially Π-shape and of which the upper end portions are connected to each other, where both base end portions of each silicon seed rod assembly 1 are supported by electrodes 13 formed in the furnace bottom 11.

Additionally, the furnace bottom 11 is provided with a plurality of raw gas supply ports 14 for supplying raw gas containing trichlorosilane and hydrogen toward the silicon seed rod assembly 1 provided inside the polycrystalline silicon reaction furnace 10. The raw gas supply ports 14 are arranged at an appropriate interval therebetween so as to uniformly supply the raw gas to the plurality of silicon seed rod assemblies 1.

The raw gas supply ports 14 are connected to a raw gas supply pipe line 15, and the raw gas supply pipe line 15 is connected to a raw gas supply source 17 via a flow rate control valve 16. Accordingly, the raw gas of which the flow rate is controlled by the flow rate control valve 16 is supplied to the raw gas supply ports 14 via the raw gas supply pipe line 15 to be thereby supplied to the inside of the polycrystalline silicon reaction furnace 10. Additionally, the furnace bottom 11 is provided with a plurality of discharge ports 18 for discharging gas obtained by a reaction of the raw gases. Also, the discharge ports 18 are arranged at the appropriate intervals therebetween so as to uniformly discharge the reacted gas, and are connected to an exhaust gas processing system 19 in the outside of the reaction furnace 10.

Figure 2:
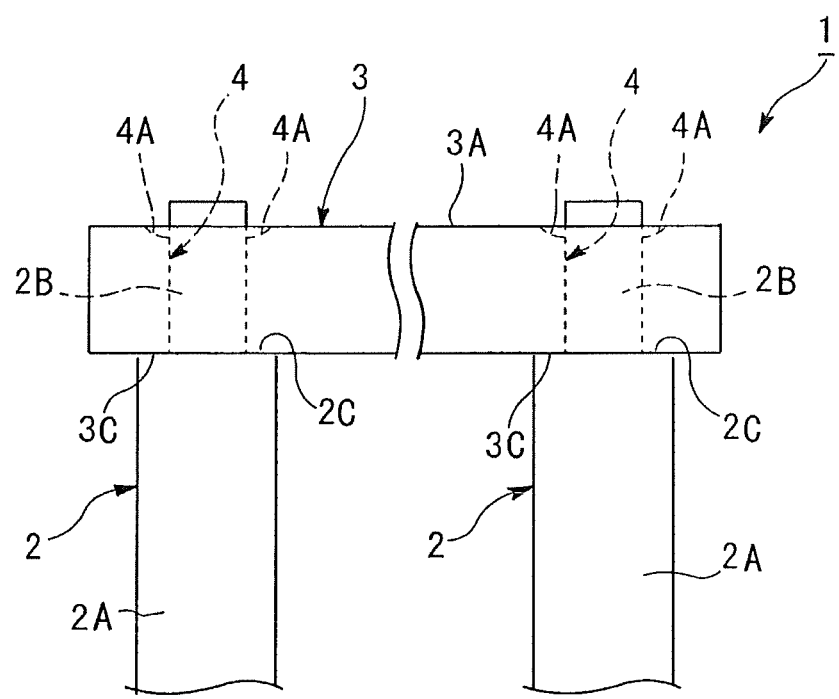
FIG. 2 is a front view showing a main part of a polycrystalline silicon seed rod assembly according to the embodiment of the invention.

As shown in FIG. 2, the silicon seed rod assembly 1 according to the present embodiment includes two silicon seed rods 2 which are arranged in parallel to each other and are formed in an angular-rod shape, and a connection member 3 which is provided in the upper end portions of the silicon seed rods 2 and is formed in an angular-rod shape or a flat-plate shape, the silicon seed rod assembly 1 being formed in a Π-shape or a inverted U-shape as a whole. Each silicon seed rod 2 is formed by cutting a polycrystalline silicon rod produced in advance, where the longitudinal upper end portion is formed in a cylindrical shape having a diameter smaller than that of a main body portion 2A and the upper end portion is an upper end portion 2B.

A step portion located between the upper end portion 2B and the main body portion 2A of the silicon seed rod 2 is provided with a flat surface disposed in a direction perpendicular to a longitudinal direction of upper end portion 2B, and the flat surface is a support surface 2C.

The silicon seed rod assembly 1 is provided with through-holes 4 which are formed in both longitudinal end portions of the connection member 3 so as to be formed through an upper surface 3A and a lower surface 3B of the connection member 3 and to make the upper end portions 2B of the silicon seed rods 2 to be inserted therethrough, respectively, Each through-hole 4 is formed in a cylindrical-hole shape having an inner diameter larger than a width of the upper end portion 2B of the silicon seed rod 2. Additionally, a length of the through-hole 4 is approximately the same as that of the upper end portion 2B or is shorter than the upper end portion 2B, and the through-hole 4 is formed in advance by a drill. Accordingly, in a state where the upper end portion 2B of the silicon seed rod 2 is inserted into the through-hole 4 of the connection member 3, the upper end of the upper end portion 2B of the silicon seed rod 2 is preferably located at the same or higher level of the upper surface of the connection member 3. FIG. 2 shows a state where the upper end portion 2B protrudes from the connection member 3.

Additionally, upon forming the through-hole 4, a direction in which the drill perforates the connection member 3 corresponds to a direction from the lower surface (a surface on one side) 3B to the upper surface (a surface on the other side) 3A in FIG. 2. Then, when the drill perforates the connection member 3, a petal-shaped defect portion 4A is formed in the opening-end peripheral edge of the through-hole 4 formed in the upper surface 3A on the front end side of the perforation direction due to brittleness of the connection member 3.

After the mechanical processing such as cutting and perforating are performed on the silicon seed rod 2 and the connection member 3, etching is performed thereon so as to clean the surface thereof and is dried, thereby ending the processes.

Figure 3:
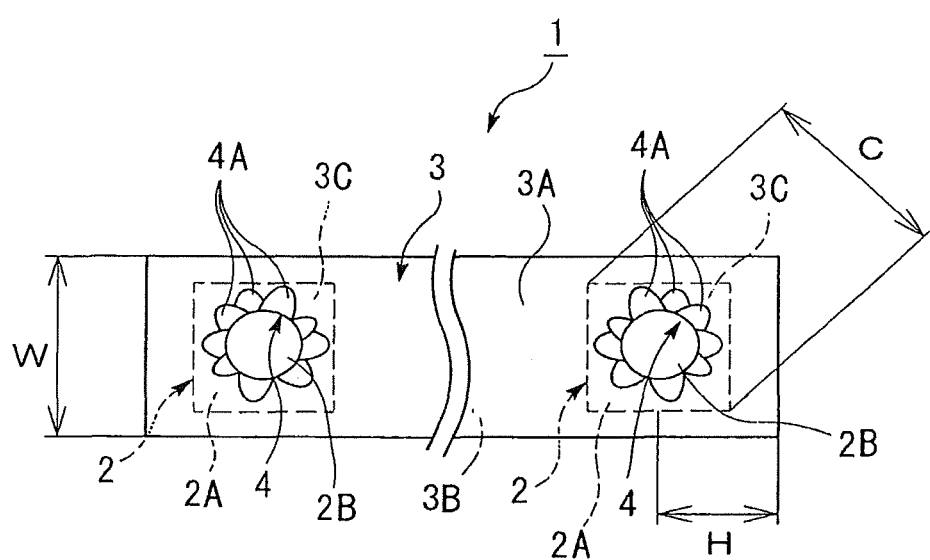
FIG. 3 is a top view showing a main part of the polycrystalline silicon seed rod assembly according to the embodiment of the invention.
Figure 4:
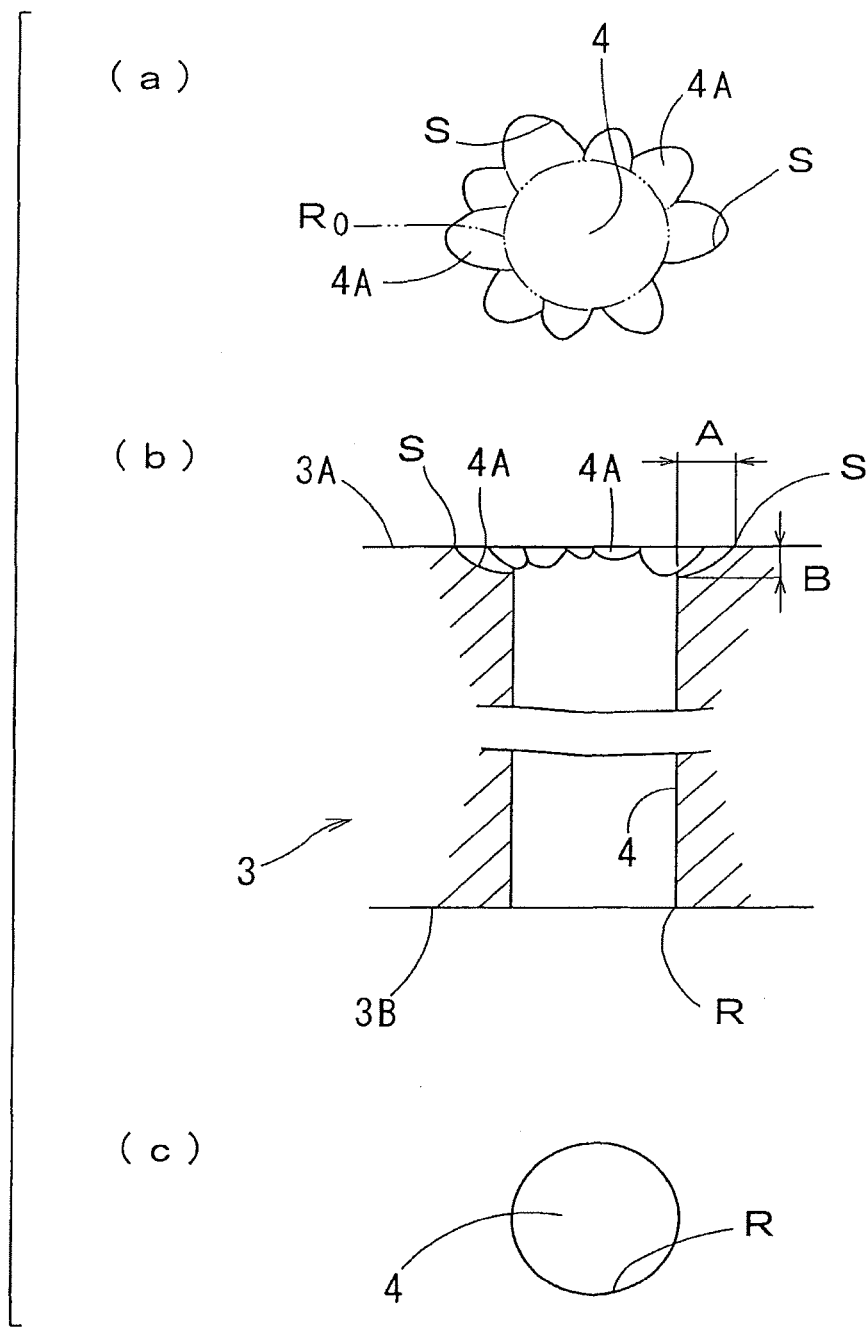
FIG. 4 is a partially enlarged views showing a connection member of the polycrystalline silicon seed rod assembly shown in FIGS. 2 and 3, where

As shown in FIG. 3, the defect portion 4A is formed in the opening-end peripheral edge of the through-hole 4 formed in the upper surface 3A of the connection member 3. Accordingly, as shown in FIGS. 4(*a*) and (*b*), at least a part of a ridge line $R_0$, in which the upper surface 3A of the connection member 3 intersects the inner-peripheral surface of the through-hole 4 and which is necessary to be formed in a circular shape, is missed at the defect portion 4A. The opening-end peripheral edge is widened and curved toward the outside of the through-hole 4 in a radial direction by a defect portion ridge line S in which the surface of the defect portion 4A intersects the upper surface 3A of the connection member 3. Meanwhile, the opening-end peripheral edge of the through-hole 4 formed in the lower surface 3B on the rear end side in a perforation direction of the drill is not provided with the defect portion 4A increasing contact resistance. That is, as shown in FIGS. 4(*b*) and (*c*), the opening-end peripheral edge of the through-hole 4 formed in the lower surface 3B is formed in a sharp circular shape, that is, a so-called sharp edge shape by a ridge line R in which the flat lower surface 3B intersects the inner-peripheral surface of the through-hole 4 and which is continuous in a circumferential direction. Additionally, the lower surface 3B is formed into a flat surface disposed in a direction perpendicular to a perforation direction of the through-hole 4, and an opening-end peripheral surface is formed into a contact surface 3C. Then, the upper end portions 2B of the two silicon seed rods 2 are inserted into the through-holes 4 formed in both end portions of the connection member 3 in a direction from the lower surface 3B to the upside, respectively, and the support surface 2C of the silicon seed rod 2 comes into contact with the contact surface 3C of the connection member 3, thereby enabling the silicon seed rods 2 to support the connection member 3. Accordingly, it is possible to satisfactorily ensure a contact area between the support surface 2C and the contact surface 3C without the defect portion 4A.

Additionally, an inner diameter of the through-hole 4 is in the range of 5 to 8 mm. In the case of the defect portion 4A, a length A in a radial direction of the through-hole 4 formed in the upper surface 3A of the connection member 3 is 3 mm or less, and a depth B in a longitudinal direction of the through-hole 4 is 2 mm or less, which are allowable ranges thereof. A width W of the connection member 3 is set to be equal to or larger than a maximum width C of the main body portion 2A of the silicon seed rod 2 (in the case of the main body portion 2A configured as an angular rod as shown in FIG. 3, a diagonal dimension of the section). A distance H from the center of the through-hole 4 to the front end portion of the connection member 3 is set to be equal to or larger than a half of the maximum width C of the main body portion 2A of the silicon seed rod 2. With such a dimension setting, the whole surface of the support surface 2C is configured to be brought into contact with the contact surface 3C of the connection member 3 regardless of a rotary direction about a shaft center of the silicon seed rod 2.

In the silicon seed rod assembly 1 according to the present embodiment, the through-hole 4 of the connection member 3 is formed in a direction perpendicular to the contact surface 3C, and the upper end portion 2B of the silicon seed rod 2 is formed in a direction perpendicular to the support surface 2C. Additionally, in the connection member 3, the opening-end peripheral edge of the through-hole 4 formed in the lower surface 3B is formed by the sharp (sharp-edge) circular ridge line R, and an opening-end peripheral surface is formed into the flat contact surface 3C. The flat support surface 2C of the silicon seed rod 2 comes into contact with the contact surface 3C, and the connection member 3 is supported by the two silicon seed rods 2, thereby forming the silicon seed rod assembly 1. Accordingly, since it is possible to satisfactorily ensure the contact area between the silicon seed rod 2 and the connection member 3, it is possible to reliably form the polycrystalline silicon without a meltdown of the contact portion caused by overheating during an ohmic heating by restricting an increase in the contact resistance.

Figure 5:
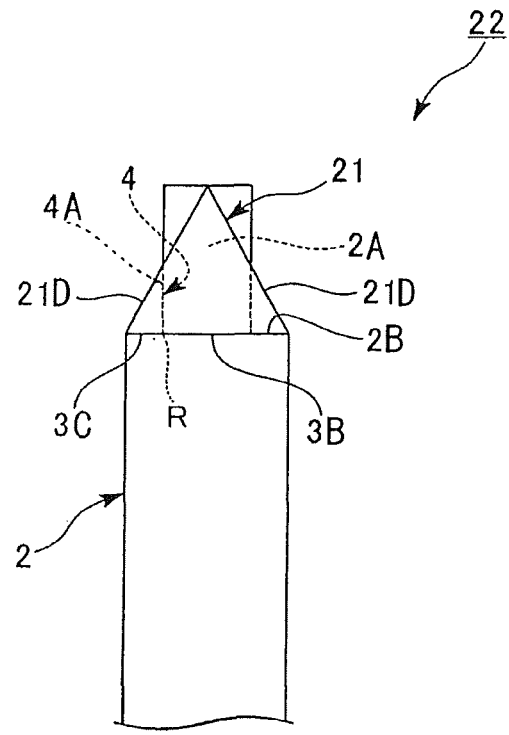
FIG. 5 is a side view showing the connection member according to a first modified example.

Additionally, the present invention is not limited to the above-described embodiment, but may be, of course, modified into various forms without departing from the spirit of the invention. For example, in the present embodiment, although the connection member 3 is formed in the angular-rod shape, the shape is not limited thereto, but may be formed in a shape according to a first modified example shown in FIG. 5. Hereinafter, components different from the above-described embodiment will be mainly described. The same reference numerals are given to the same components, and the description thereof will be omitted.

In the first modified example, a side surface 21D of a connection member 21 is formed into an inclined surface, and a section in a direction perpendicular to a longitudinal direction thereof is formed in a triangular shape. Then, when the through-hole 4 is formed in advance by drilling the lower surface 3B corresponding to a base of the triangular section of the connection member 21 for apex, the opening-end peripheral edge is formed by the sharp (sharp-edge) ridge line R without forming the defect portion 4A in the opening-end peripheral edge of the through-hole 4 formed in the lower surface 3B of the connection member 21. Also, the flat contact surface 3C is formed in the periphery of the opening end in a direction perpendicular to a perforation direction of the through-hole 4.

Then, the upper end portions 2B of the two silicon seed rods 2 are inserted into the through-holes 4 formed in both end portions of the connection member 21 in a direction from the lower surface 3B to the upside, respectively, and the flat support surface 2C of the silicon seed rod 2 comes into contact with the contact surface 3C of the connection member 21 so as to support the connection member 21 by means of the two silicon seed rods 2, thereby forming the silicon seed rod assembly 22. Accordingly, it is possible to satisfactorily ensure a contact area between the silicon seed rod 2 and the connection member 21 and to prevent the meltdown of the contact portion caused by overheating during an ohmic heating. Additionally, since the side surface 21D of the connection member 21 is formed into an inclined surface by gradually decreasing a horizontal width thereof in an upward direction, silica or foreign material flowing from the above of the connection member 21 is hardly collected or attached thereto upon producing the polycrystalline silicon, thereby producing highly pure polycrystalline silicon.

Additionally, the section shape of the connection member is not limited to the angular shape or the triangular shape described above, but may be different shapes so long as the opening-end peripheral edge of the through-hole is formed by the sharp (sharp-edge) ridge line R, the flat contact surface 3C is formed in periphery of the opening end in a direction perpendicular to a perforation direction of the through-hole 4, and the contact area between the contact surface 3C and the support surface 2C is satisfactorily ensured. It is desirable to form the side surface 21D of the connection member 21 into an inclined surface since it is possible to form the highly pure polycrystalline silicon on the grounds of the above-described reason.

Figure 6:
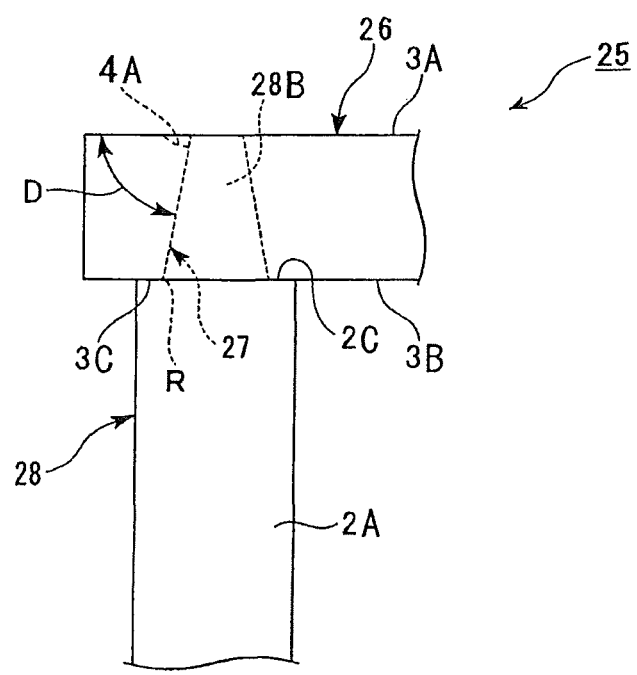
FIG. 6 is a front view showing the connection member according to a second modified example.
Figure 7:
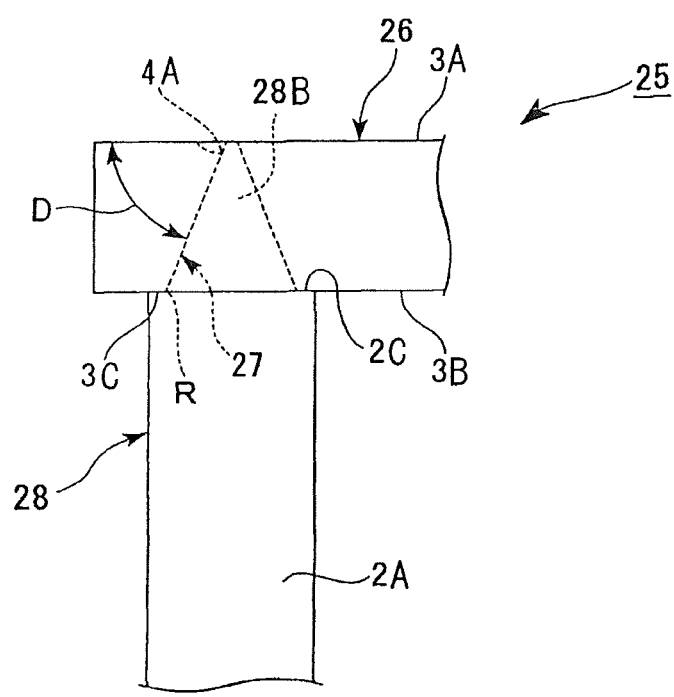
FIG. 7 is a front view showing the connection member according to a third modified example.

Further, like a silicon seed rod assembly 25 according to a second modified example shown in FIG. 6 and a third modified example shown in FIG. 7, a through-hole 27 formed through a connection member 26 may be formed in a substantially conical shape of which a head portion is cut out by gradually decreasing a diameter thereof in a direction from the lower surface 3B to the upper surface 3A of the connection member 26, the flat contact surface 3C may be provided in a direction perpendicular to a perforation direction of the through-hole 27, and then an upper end portion 28B of a silicon seed rod 28 may be formed in a substantially conical shape of which a head portion is cut out so as to match with the shape of the through-hole 27. In order to perforate the through-hole 27, for example, a special drill is prepared in advance of which the front end portion is formed to have an acute angle, a perforation depth is determined by means of a jig or the like, and then the drilling is carried out in a direction from the lower surface 3B to the upper surface 3A. Accordingly, the defect portion 4A is formed in the upper surface 3A of the connection member 26, but the opening-end peripheral edge of the lower surface 3B of the connection member 26 is formed by the sharp ridge line R.

In the case of forming the through-hole 27, an angle D formed between the upper surface 3A of the connection member 26 and the inner-peripheral surface of the through-hole 27 is desirably in the range of 45° to 80°, and more desirably in the range of 75° to 80°. Likewise, by making the through-hole 27 of the connection member 26 and the upper end portion 28B of the silicon seed rod 28 to be brought into contact with each other with large area, it is possible to more reliably ensure the contact area and to prevent the meltdown during an ohmic heating.

Additionally, although the angle D formed between the upper surface 3A of the connection member 26 and the inner-peripheral surface of the through-hole 27 according to the second modified example shown in FIG. 6 is different from that according to the third modified example shown in FIG. 7, the same reference numeral is used in both drawings.

Further, in the present embodiment, although the silicon seed rod is formed in the angular-rod shape, the shape is not limited thereto, but the section of the rod-shape silicon seed rod may be formed in a polygonal shape instead of a square shape. Alternatively, the section of the rod-shape silicon seed rod may be formed in a shape in which angular portions are chamfered into a flat surface (C-chamfered) or are chamfered into a circular-arc surface (R-chamfered), or may be formed in a circular shape or an oval shape.

Figure 8:
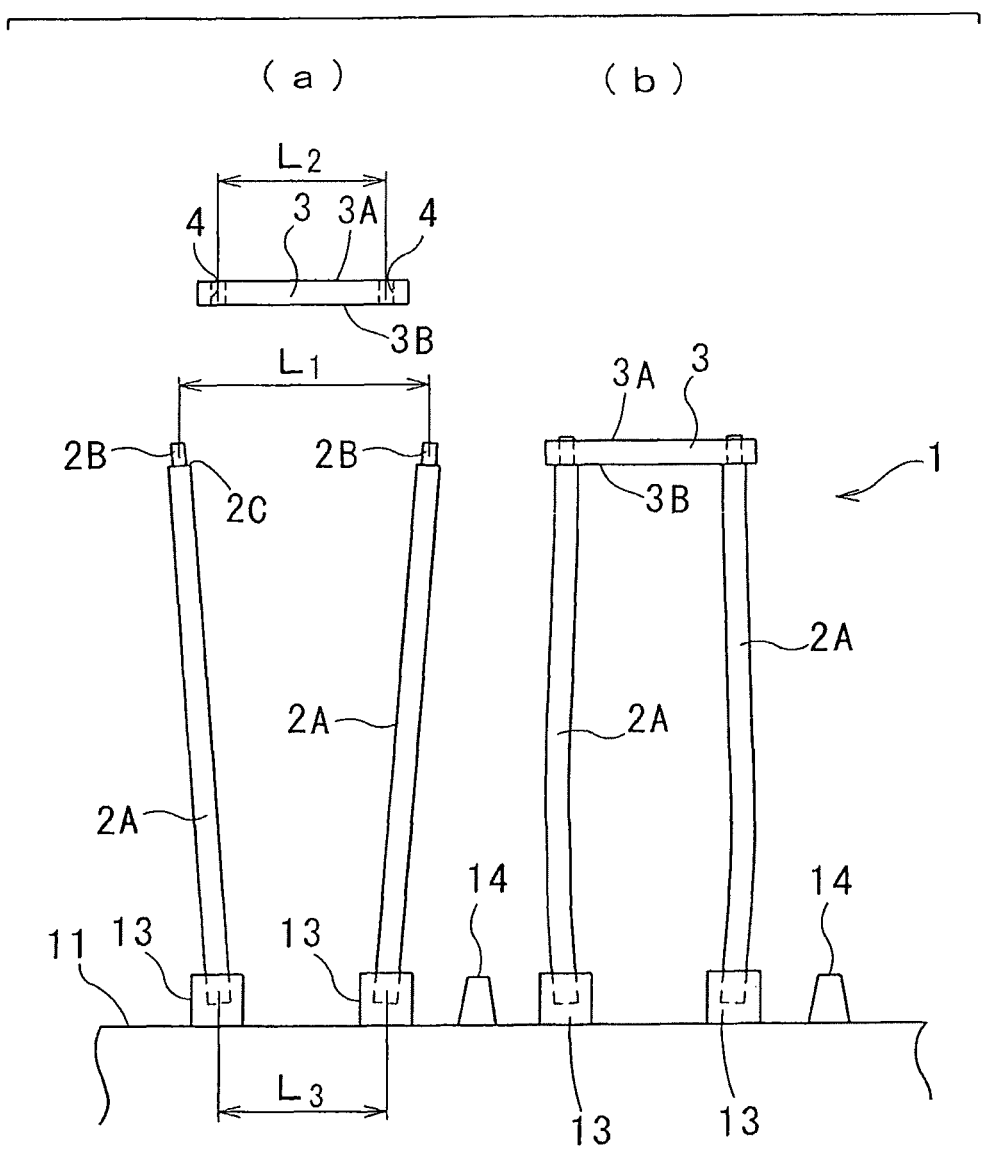
FIG. 8 is a front views showing the silicon seed rod assembly according to another embodiment of the invention, where

Furthermore, in the above-described embodiment, although both silicon seed rods are uprightly provided, both silicon seed rods may be provided while being inclined with respect to a perpendicular direction and may be connected to each other in a bent state by means of the connection member as shown in FIG. 8. In a state before connecting both silicon seed rods to each other as shown in FIG. 8(a), both silicon seed rods 2 are supported in an inclined state so as to be gradually distanced from each other in a direction from the base end portion to the upper end portion 2B. At this time, a gap $L_1$ between the upper end portions 2B of the pair of silicon seed rods 2 is wider than a gap $L_2$ between the pair of through-holes 4 formed in the connection member 3. Additionally, the gap $L_2$ between both through-holes 4 formed in the connection member 3 is set to be equal to a gap $L_3$ between seed rod supporting portions of both electrodes 13 by which the silicon seed rod assembly 1 is supported. Even in this case, the defect portion 4A may be formed in the opening-end peripheral edge of the upper surface 3A of the connection member 3, but the opening-end peripheral edge of the lower surface 3B of the connection member 3 is formed by the sharp ridge line R in which the inner-peripheral surface of the through-hole 27 intersects the lower surface 3B.

Figure 9:
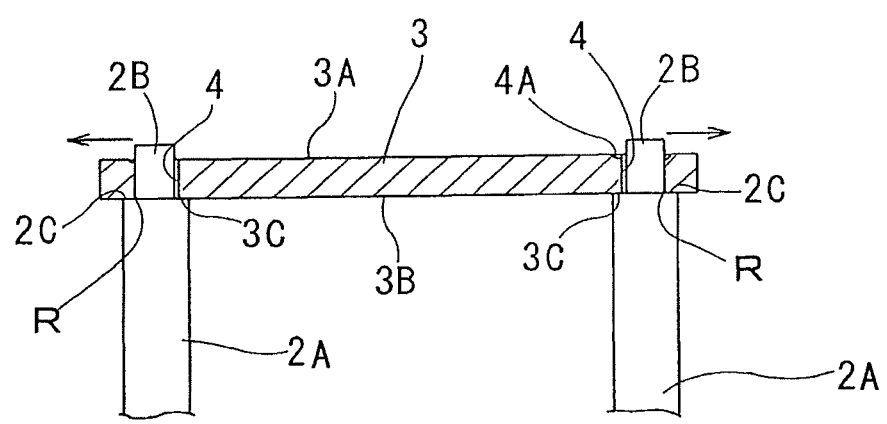
FIG. 9 is a partially enlarged view showing the connection member in the connection state shown in FIG. 8(b).

Then, as shown in FIG. 8(b), both silicon seed rods 2 are bent so as to make the upper end portions 2B thereof to be close to each other, and then the upper end portions 2B are inserted into the through-holes 4 of the connection member 3, respectively. In this assembled state, since the silicon seed rods 2 are connected to each other by means of the connection member 3 in a bent state, a stretching force caused by a restoring force acts on the connection member 3 in a direction in which both through-holes 4 are separated from each other as depicted by arrows shown in FIG. 9. Accordingly, the circular-arc surface on the outer side in a separation direction (designated by arrows in FIG. 9) of the upper end portion 2B of each silicon seed rod 2 comes into pressing-contact with the corresponding circular-arc surface on the outer side in the separation direction (designated by arrows in FIG. 9) of the inner-peripheral surface of the through-hole 4 of the connection member 3.

When a polycrystalline silicon rod is formed by the silicon seed rod assembly 1 assembled in this way, since the pair of silicon seed rods 2 comes into pressing-contact with the connection member 3 to thereby improve the contact state thereof, it is possible to satisfactorily heat the silicon seed rod assembly 1 by supplying current thereto. Accordingly, it is possible to make high-quality polycrystalline silicon to be deposited on a circumferential surface of the silicon seed rod 2.

Further, since a friction force is produced between the upper end portions 2B of both silicon seed rods 2 and the inner-peripheral surfaces of the through-holes 4 of the connection member 3, even when reactive gas makes contact with the connection member 3 to thereby apply a blow up force thereto, the connection member 3 is not detached from the silicon seed rods 2.

In the example shown in FIG. 8, although it is not described particularly, the linear silicon seed rod is supported by the electrode in an inclined state. When both silicon seed rods are not formed in the linear shape and are bent, both silicon seed rods may be arranged so as to be gradually distanced from each other in a direction from the base end portion to the upper end portion due to the bending thereof, and may be connected to each other by decreasing the distance between the upper end portions.

On the contrary to the example shown in FIG. 8, the silicon seed rods may be uprightly provided in a state where a gap between the upper end portions of the silicon seed rods is narrower than a gap between the through-holes of the connection member, and may be inserted into both through-holes of the connection member by widening the gap between the upper end portions of the silicon seed rods.

Further, a gap between the silicon seed rod supporting portions of the electrodes may be set to be different from a gap between the through-holes of the connection member, the silicon seed rods may be uprightly provided in the electrodes in a perpendicular direction, and then the upper end portions of the silicon seed rods may be connected to each other by means of the connection member by bending the silicon seed rods. In a case where the gap between the through-holes of the connection member is wider than the gap between the electrodes, when the silicon seed rods are connected to each other by means of the connection member, a pressing force occurs in a direction in which the upper end portions of the silicon seed rods become closer to each other. On the contrary, in a case where the gap between the through-holes of the connection member is narrower than the gap between the electrodes, when the silicon seed rods are connected to each other by means of the connection member, a pressing force occurs in a direction in which the upper end portions of the silicon seed rods get apart from each other.

As described above, in the above-described embodiments, an angle formed between the contact surface and the through-hole of the connection member is equal to an angle formed between the support surface and the upper end portion of the silicon seed rod, and the contact surface of the connection member makes contact with the support surface of the silicon seed rod in a state where the upper end portion of the silicon seed rod is inserted into the through-hole of the connection member. At this time, the angle is desirably 90°.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A method of forming a silicon seed rod assembly which is used for producing polycrystalline silicon by a vapor deposition method and includes two rod-shape silicon seed rods and a silicon connection member bridging the silicon seed rods, comprising the steps of:
    forming a support surface at a step portion between an upper end portion and a main body portion of each silicon seed rod so as to be disposed in a direction perpendicular to a longitudinal direction of the upper end portion;
    forming a pair of through-holes by perforating the silicon connection member from one side surface thereof by a drill in a direction perpendicular to the one side surface;
    setting the two silicon seed rods positioned to be in an inclined state on a pair of electrodes provided in a reaction furnace, wherein a horizontal distance between the two silicon seed rods gradually increases in a direction from a base end portion to the upper end portion of the silicon seed rods; and
    inserting each upper end portion of each silicon seed rod into each through-hole of the silicon connection member so as to make the upper end portions of the two silicon seed rods to be close to each other and so as to form a curvature in the two silicon seed rods, wherein the one side surface comes into contact with the support surface of the silicon seed rod;
    wherein a distance L1 between the upper end portions of the two silicon seed rods before insertion into the connection member is larger than a distance L2 between the pair of through-holes formed in the connection member;
    whereby causing a stretching force of the silicon seed rods acting on the silicon connection member in a longitudinal direction of the silicon connection member.

2. A method of producing polycrystalline silicon comprising the steps of:
    forming a silicon seed rod assembly by uprightly supporting silicon seed rods by a pair of electrodes, respectively, disposed in a bottom portion in a reaction furnace and by providing a silicon connection member between upper end portions of the silicon seed rods;

heating the silicon seed rods by supplying current to the electrodes;

reacting the raw gas supplied to the reaction furnace; and depositing polycrystalline silicon on surfaces of the silicon seed rods, wherein the step of forming the silicon seed rod assembly includes the steps of:

forming a support surface at a step portion between an upper end portion and a main body portion of each silicon seed rod so as to be disposed in a direction perpendicular to a longitudinal direction of the upper end portion;

forming a through-hole by perforating the connection member from one side surface thereof by means of a drill in a direction perpendicular to the one side surface;

setting the two silicon seed rods positioned to be in an inclined state on the electrodes provided in the reaction furnace, wherein a horizontal distance between the two silicon seed rods gradually increases in a direction from a base end portion to the upper end portion of the silicon seed rods; and inserting each upper end portion of each silicon seed rod into each through-hole of the silicon connection member so as to make the upper end portions of the two silicon seed rods to be close to each other and so as to form a curvature in the two silicon seed rods, wherein the one side surface comes into contact with the support surface of the silicon seed rod;

wherein a distance L1 between the upper end portions of the two silicon seed rods before insertion into the connection member is larger than a distance L2 between the pair of through-holes formed in the connection member;

whereby causing a stretching force of the silicon seed rods acting on the silicon connection member in a longitudinal direction of the silicon connection member.

3. The method of forming a silicon seed rod assembly according to claim 2, wherein, the two silicon seed rods come into pressing-contact with the silicon connection member.

\* \* \* \* \*